United States Patent
Sung

(10) Patent No.: US 9,338,856 B2
(45) Date of Patent: May 10, 2016

(54) LIGHT EMITTING DEVICE

(71) Applicant: Ultimate Image Corporation, Miaoli (TW)

(72) Inventor: Chih-Feng Sung, Miaoli (TW)

(73) Assignee: Ultimate Image Corporation, Miaoli (TW)

( * ) Notice: Subject to any disclaimer, the term of this patent is extended or adjusted under 35 U.S.C. 154(b) by 156 days.

(21) Appl. No.: 13/897,670

(22) Filed: May 20, 2013

(65) Prior Publication Data

US 2013/0320879 A1 Dec. 5, 2013

(30) Foreign Application Priority Data

Jun. 4, 2012 (TW) .............................. 101119947 A

(51) Int. Cl.

| | |
|---|---|
| H01J 1/62 | (2006.01) |
| G09G 3/10 | (2006.01) |
| H05B 37/00 | (2006.01) |
| H05B 33/08 | (2006.01) |
| G09G 3/34 | (2006.01) |
| H01J 1/52 | (2006.01) |
| H01J 17/49 | (2012.01) |
| H01J 19/66 | (2006.01) |
| H01L 51/52 | (2006.01) |
| H01L 33/62 | (2010.01) |

(52) U.S. Cl.
CPC ................ *H05B 37/00* (2013.01); *G09G 3/342* (2013.01); *H01J 1/52* (2013.01); *H01J 17/491* (2013.01); *H01J 19/66* (2013.01); *H01L 51/5203* (2013.01); *H05B 33/0887* (2013.01); *H01L 33/62* (2013.01); *H01L 2924/0002* (2013.01)

(58) Field of Classification Search
CPC ........... H01J 1/52; H01J 17/49; H01J 17/491; H01J 19/66; H03B 33/0887; G09G 3/342; G09G 3/006
USPC .......... 313/506, 503, 455–498; 315/291, 160, 315/169.3; 345/211, 204, 205
See application file for complete search history.

(56) References Cited

U.S. PATENT DOCUMENTS

| | | | |
|---|---|---|---|
| 7,164,229 B2 * | 1/2007 | Lai ....................... | H01L 27/3276 174/250 |
| 7,586,265 B2 * | 9/2009 | Heuser et al. .............. | 315/169.3 |
| 7,626,332 B2 * | 12/2009 | Su et al. ........................ | 313/506 |

FOREIGN PATENT DOCUMENTS

JP         2005070813 A   *   3/2005

* cited by examiner

*Primary Examiner* — Dinh T Le
(74) *Attorney, Agent, or Firm* — Trop Pruner & Hu, P.C.

(57) ABSTRACT

A light emitting device includes a main body that defines an inner space therein and that includes a light-transmissive part, a light emitting unit disposed in the inner space, and an electrode. The electrode has a device-connecting portion electrically connected to and extending from the light emitting unit, a power-connecting portion disposed outwardly of the main body and electrically connected to an electric power source, and a resistance-configurable portion that extends between and that interconnects electrically the device-connecting portion and the power-connecting portion and that is configurable to set resistance of the electrode.

11 Claims, 3 Drawing Sheets

US 9,338,856 B2

LIGHT EMITTING DEVICE

CROSS-REFERENCE TO RELATED APPLICATION

This application claims priority of Taiwanese Application No. 101119947, filed on Jun. 4, 2012.

BACKGROUND OF THE INVENTION

1. Field of the Invention

The present invention relates to a light emitting device with a resistance-configurable electrode.

2. Description of the Related Art

Referring to FIGS. 1 and 2, a conventional light emitting device 1 includes a first substrate 11, a second substrate 12, a light emitting unit 13 and electrodes 14.

The first substrate 11 and the second substrate 12 are spaced apart from each other and cooperate with a surrounding wall connected therebetween to define an inner space 101. The light emitting unit 13 is an organic light emitting diode (OLED) and is disposed in the inner space 101. The light emitting unit 13 is operable to emit light through at least one of the first and second substrates 11, 12, usually the first substrate 11, when electricity is supplied thereto. Each electrode 14 is a rectangular film, and has one end electrically connected to the light emitting unit 13 and the other end that extends outwardly of the inner space 101 along a surface of the first substrate 11 and that is adapted to be electrically connected to an electric power source (not shown).

However, light emitting characteristics of the light emitting units 13 may vary among different light emitting devices 1. Therefore, when a plurality of the conventional light emitting devices 1 are assembled in a same apparatus to form a product such as a lamp, the lamp may provide uneven brightness.

Two possible approaches are often employed to address the aforesaid problem. In one approach, each of the light emitting devices 1 is provided with an independent electric power source, and voltage of each electric power source is adjusted to result in uniform illumination of the light emitting devices 1. In another approach, each of the light emitting devices 1 is provided with an independent adjustable resistor, the resistance of which is adjustable to adjust the voltage fed to the respective light emitting unit 13, thereby making it possible for the light emitting devices 1 to emit uniform brightness.

Nevertheless, providing the light emitting devices 1 with independent electric power sources and/or independent adjustable resistors may increase a size of the apparatus and incur higher manufacturing cost.

SUMMARY OF THE INVENTION

Therefore, an object of the present invention is to provide a light emitting device that may alleviate the above drawbacks of the prior art.

Accordingly, a light emitting device of the present invention is adapted to be electrically connected to an electric power source. The light emitting device includes a main body, a light emitting unit and an electrode unit.

The main body defines an inner space therein, and includes a light-transmissive part. The light emitting unit is disposed in the inner space of the main body, and is operable to emit light through the light-transmissive part of the main body. The electrode unit is for connecting the light emitting unit to the electric power source, and includes an electrode.

The electrode has a device-connecting portion, a power-connecting portion and a resistance-configurable portion. The device-connecting portion is electrically connected to and extends from the light emitting unit. The power-connecting portion is disposed outwardly of the main body, and is adapted to be electrically connected to the electric power source. The resistance-configurable portion extends between and interconnects electrically the device-connecting portion and the power-connecting portion. The resistance-configurable portion is configurable to set resistance of the electrode.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
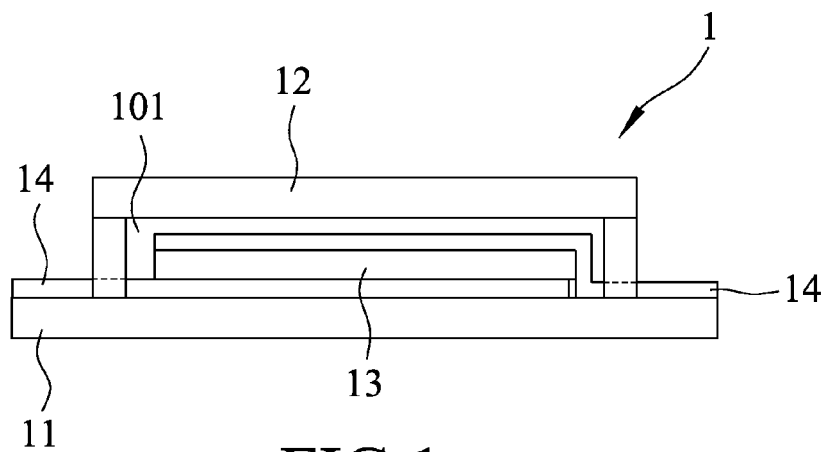
FIG. 1 is a schematic side view of a conventional light emitting device.
Figure 2:
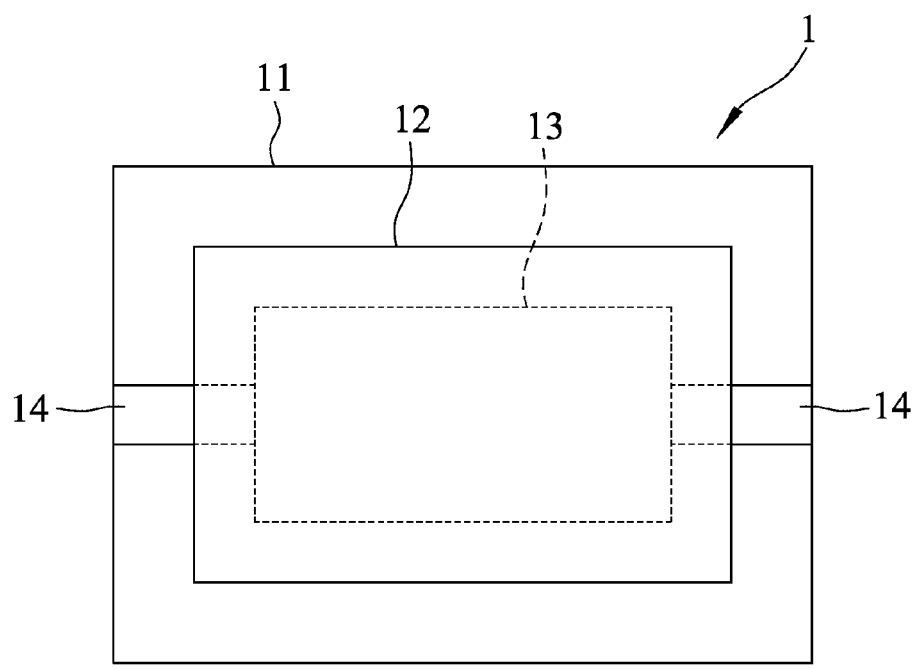
FIG. 2 is a schematic top view of the conventional light emitting device.

Before the present invention is described in greater detail, it should be noted that like elements are denoted by the same reference numerals throughout the disclosure.

Figure 3:
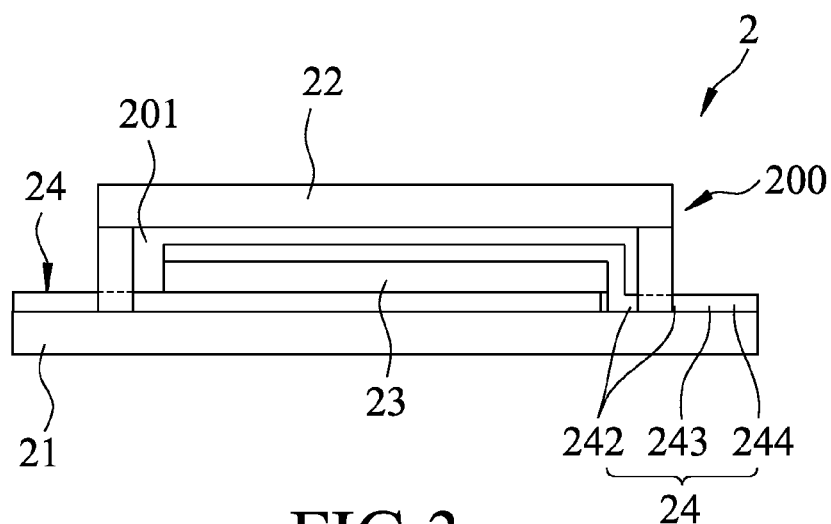
FIG. 3 is a schematic side view of a first preferred embodiment of a light emitting device according to the present invention.
Figure 4:
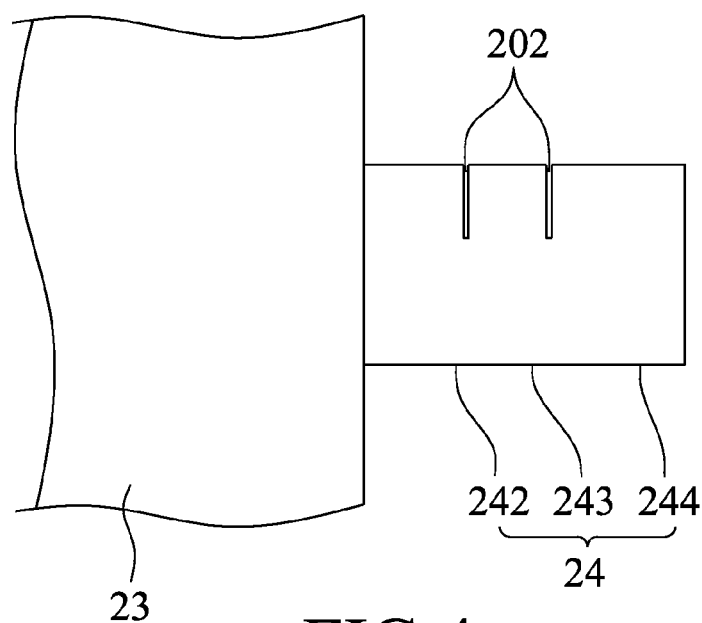
FIG. 4 is a fragmentary top view showing an electrode of the first preferred embodiment of the light emitting device according to the present invention.

Referring to FIGS. 3 and 4, a first preferred embodiment of the light emitting device 2 according to the present invention includes a first substrate 21, a second substrate 22, a light emitting unit 23, and an electrode unit including electrodes 24.

The first and second substrates 21, 22 are substantially rectangular thin substrates, are spaced apart from each other, and cooperate with a surrounding wall connected therebetween to form a main body 200 that defines an inner space 201 therein. The light emitting unit 23 is an organic light emitting diode (OLED), is disposed in the inner space 201, and is operable to emit light through at least one of the first and second substrates 21, 22 when electricity is supplied thereto. In this preferred embodiment, the first substrate 21 is a glass substrate and serves as a light-transmissive part of the main body 200.

The electrodes 24 are for connecting the light emitting unit 23 to an electric power source (not shown). In this preferred embodiment, at least one of the electrodes 24 has a device-connecting portion 242, a resistance-configurable portion 243, and a power-connecting portion 244. The device-connecting portion 242 is electrically connected to and extends from the light emitting unit 23 along a surface of the first substrate 21, and extends outwardly of the inner space 201. The power-connecting portion 244 is disposed outwardly of the inner space 201 and is adapted to be electrically connected to the electric power source. The resistance-configurable portion 243 extends between and interconnects electrically the device-connecting portion 242 and the power-connecting portion 244, and is configurable to set resistance of the electrode 24.

Specifically, the electrode 24 in this preferred embodiment is a rectangular electrically-conductive member, and the resistance-configurable portion 243 is configured with at least one cutout 202 by laser-cutting or mechanical-cutting. The cutout 202 reduces area of the resistance-configurable portion 243 of the electrode 24 to set the resistance of the electrode 24, as well as an effective resistance of the light emitting device 2. By setting the resistance of the electrode 24, a desired amount of electric current may be supplied to the light emitting unit 23 for achieving a desired brightness of the light emitting device 2.

Therefore, when a plurality of the light emitting devices 2 according to the first preferred embodiment of the present invention are assembled to form a product, such as a lamp, light emitting characteristic of each light emitting device 2 is first individually measured. Thereafter, the resistance-configurable portions 243 of the electrodes 24 of the light emitting devices 2 may be configured with the cutouts 202 by laser-cutting or mechanical-cutting for reducing areas of the resistance-configurable portions 243 to set the resistances of the electrodes 24, as well as the effective resistances of the light emitting devices 2, according to the differences in the light emitting characteristics. Therefore, the brightness of the plurality of the light emitting devices 2 may be made uniform without adding additional units or electric power sources.

Figure 5:
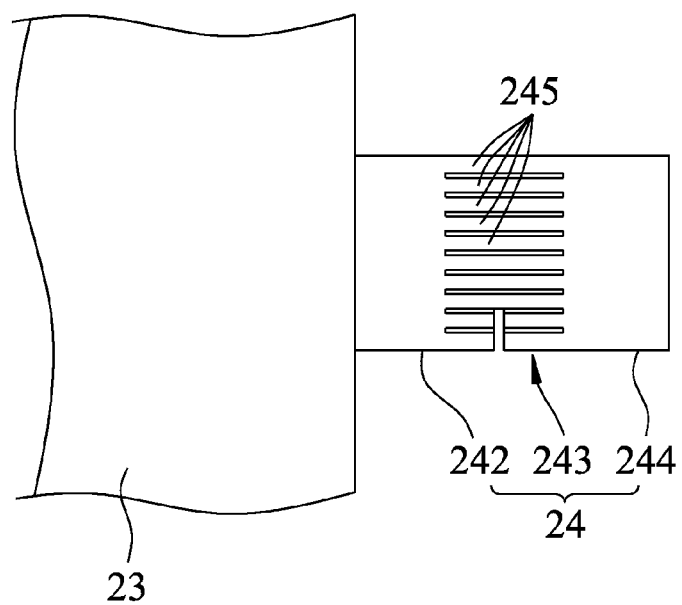
FIG. 5 is a fragmentary top view of a second preferred embodiment of the light emitting device according to the present invention.

Referring to FIG. 5, the second preferred embodiment of the light emitting device 2 according to the present invention is similar to the first preferred embodiment. The only difference resides in that the resistance-configurable portion 243 of the electrode 24 of the light emitting device 2 includes a plurality of spaced-apart strips 245, and the strips 245 are selectively severed to set the resistance of the electrode 24.

Specifically, the strips 245 extend between and interconnect electrically the device-connecting portion 242 and the power-connecting portion 244. The strips 245 are selectively severed by laser-cutting or mechanical-cutting to set the resistance of the electrode 24, as well as the effective resistance of the light emitting device 2. Like the previous preferred embodiment, by setting the resistance of the electrode 24, a desired electric current may be supplied to the light emitting unit 23 for achieving a desired brightness of the light emitting device 2.

In this preferred embodiment, the resistance-configurable portion 243 of the electrode 24 of the light emitting device 2 includes ten strips 245 connected in parallel. Each strip 245 has a resistance that is substantially 1Ω. In other words, the resistance of the electrode 24 with all ten strips 245 is substantially 0.1Ω. If two of the strips 245 are selected to be severed by laser-cutting, the resistance of the electrode 24 becomes substantially 0.125Ω. Consequently, the desired resistance of the electrode 24 as well as the desired effective resistance of the light emitting device 2 may be simply set by selectively severing the strips 245, instead of adding additional resistors or independent electric power sources.

It is noted that, the cutout 202 and the electrode 24 of the light emitting device 2 are rectangular in the first and second preferred embodiments of the present invention. However, the shapes and the sizes of the cutout 202 and the electrode 24 should not be limited to these preferred embodiments. Moreover, the strips 245 in this preferred embodiment are disposed parallel to each other with a uniform spacing therebetween. In addition, the strips 245 have a uniform length and a uniform width. With such configuration, the electrode resistance may be precisely set while incurring the least cost.

Figure 6:
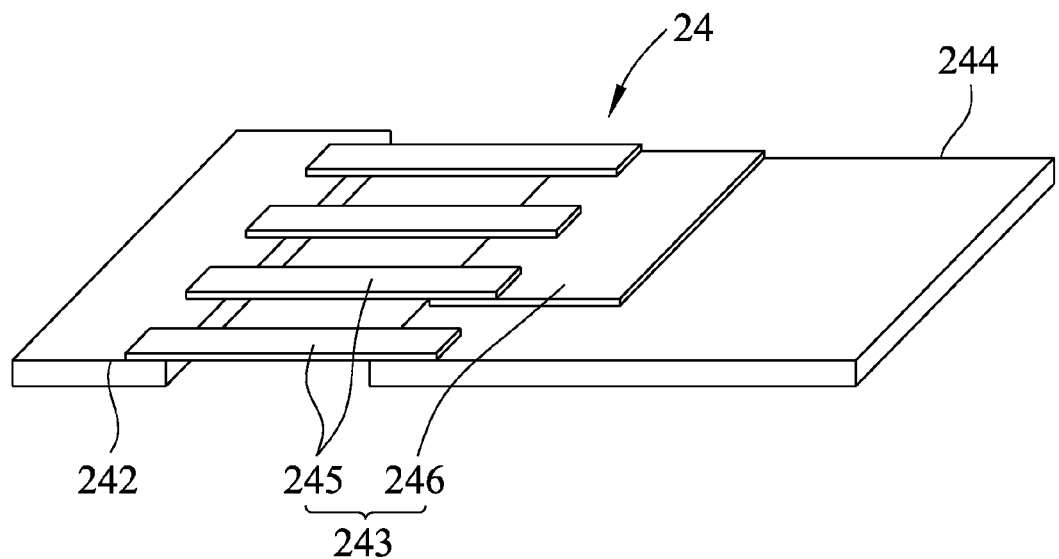
FIG. 6 is an enlarged fragmentary perspective view showing an electrode of a third preferred embodiment of the light emitting device according to the present invention.

Referring to FIG. 6, the third preferred embodiment of the light emitting device 2 according to the present invention is similar to the second preferred embodiment. The only difference resides in that the resistance-configurable portion 243 of the electrode 24 of the light emitting device 2 further includes an electrical insulation layer 246 between selected ones of the strips 245 and one of the device-connecting portion 242 and the power-connecting portion 244. The electrical insulation layer 246 is for breaking electrical connection between the device-connecting portion 242 and the power-connecting portion 244 through the selected ones of the strips 245.

The resistance-configurable portion 243 of the electrode 24 of this preferred embodiment may be prepared in a number of ways. For example, parts of the electrical insulation layer 246 between the strips 245 and one of the device-connecting portion 242 and the power-connecting portion 244 may be selectively removed by laser ignition to enable selected ones of the strips 245 to connect electrically the device-connecting portion 242 and the power-connecting portion 244, thereby setting a desired resistance of the electrode 24 of the light emitting device 2.

To conclude, the resistance-configurable portion 243 of the electrode 24 of the light emitting device 2 according to the present invention is configurable to set resistance of the electrode 24. In one preferred embodiment, the resistance-configurable portion 243 may be configured with the cutout 202 to reduce area of the resistance-configurable portion 243. In another preferred embodiment, the resistance-configurable portion 243 may include the plurality of spaced-apart strips 245 that are selectively severed. In yet another preferred embodiment, the resistance-configurable portion 243 may further include the electrical insulation layer 246 between selected ones of the strips 245 and one of the device-connecting portion 242 and the power-connecting portion 244 to break electrical connection between the device-connecting portion 242 and the power-connecting portion 244 through the selected ones of the strips 245. When a plurality of the light emitting devices 2 are assembled to form a lamp, additional resistors or independent electric power sources are not needed to achieve uniform brightness of the light emitting devices 2 by virtue of the resistance-configurable portion 243 according to the present invention.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A light emitting device adapted to be electrically connected to an electric power source, said light emitting device comprising:

a main body defining an inner space therein, and including a light-transmissive part;

a light emitting unit disposed in said inner space of said main body, and operable to emit light through said light-transmissive part of said main body; and an electrode unit for connecting said light emitting unit to the electric power source, said electrode unit including an electrode, said electrode having
a device-connecting portion that is electrically connected to and extends from said light emitting unit,
a power-connecting portion that is disposed outwardly of said main body and that is adapted to be electrically connected to the electric power source, and a resistance-configurable portion that extends between and that interconnects electrically said device-connecting portion and said power-connecting portion and that is configured with a cutout to reduce area of said resistance-configurable portion and thereby set the resistance of said electrode.

2. The light emitting device as claimed in claim 1, wherein said light-transmissive part of said main body is a substrate part.

3. The light emitting device as claimed in claim 1, wherein said cutout extends from an edge of said resistance-configurable portion.

4. The light emitting device as claimed in claim 1, wherein said resistance-configurable portion includes a plurality of spaced-apart strips.

5. The light emitting device as claimed in claim 4, wherein said strips are selectively severed to set the resistance of said electrode.

6. The light emitting device as claimed in claim 5, wherein said strips are disposed parallel to each other.

7. The light emitting device as claimed in claim 6, wherein said strips have a uniform length and a uniform width.

8. The light emitting device as claimed in claim 7, wherein said strips have a uniform spacing therebetween.

9. The light emitting device as claimed in claim 4, wherein said resistance-configurable portion further includes an electrical insulation layer between selected ones of said strips and one of said device-connecting portion and said power-connecting portion to break electrical connection between said device-connecting portion and said power-connecting portion through the selected ones of said strips.

10. The light emitting device as claimed in claim 9, wherein said strips are disposed parallel to each other.

11. The light emitting device as claimed in claim 10, wherein said strips have a uniform length and a uniform width.

* * * * *